(12) United States Patent
Coughlin, Jr. et al.

(10) Patent No.: US 6,493,257 B1
(45) Date of Patent: Dec. 10, 2002

(54) CMOS STATE SAVING LATCH

(75) Inventors: Terry C. Coughlin, Jr., Endicott, NY (US); Roger P. Gregor, Endicott, NY (US); Steven F. Oakland, Colchester, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/108,687

(22) Filed: Mar. 27, 2002

(51) Int. Cl.[7] ............................................. G11C 11/412
(52) U.S. Cl. ...................... 365/156; 365/154; 365/233; 365/229; 365/228; 365/227; 365/226
(58) Field of Search ................................. 365/154, 156, 365/226, 227, 228, 229, 333, 189.05

(56) References Cited

U.S. PATENT DOCUMENTS

| | | | |
|---|---|---|---|
| 4,503,494 A | 3/1985 | Hamilton et al. ............ 365/229 |
| 4,980,859 A | 12/1990 | Guterman et al. ........... 365/154 |
| 5,257,223 A | 10/1993 | Dervisoglu .................. 365/154 |
| 5,532,958 A | 7/1996 | Jiang et al. .................. 365/154 |
| 5,682,345 A | 10/1997 | Roohparvar et al. ... 365/185.04 |
| 5,844,422 A | 12/1998 | Trimberger et al. ........... 326/38 |
| 5,889,697 A | * 3/1999 | Selcuk et al. ................ 365/154 |
| 5,986,962 A | 11/1999 | Bertin et al. ................. 365/228 |
| 6,034,886 A | * 3/2000 | Chan et al. .................. 365/154 |
| 6,091,626 A | * 7/2000 | Madan ......................... 365/154 |
| 6,118,689 A | * 9/2000 | Kuo et al. .................... 365/154 |

* cited by examiner

Primary Examiner—Andrew Q. Tran
(74) Attorney, Agent, or Firm—Michael F. Hoffman; Hoffman, Warnick & D'Alessandro LLC

(57) ABSTRACT

A state saving circuit and method for using the same. The circuit comprises a first latch powered by an uninterrupted power supply, wherein the first latch includes a first pair of cross coupled inverters for storing data, and includes an input cut-off control for isolating the data in the first pair of cross coupled inverters; a second latch coupled to an output of the first latch and powered by an interruptible power supply, wherein the second latch includes a second pair of cross coupled inverters and a clock input for latching the data from the first latch to the second latch; and wherein an interruption of power to the second latch results in a state being saved in the first latch.

20 Claims, 1 Drawing Sheet

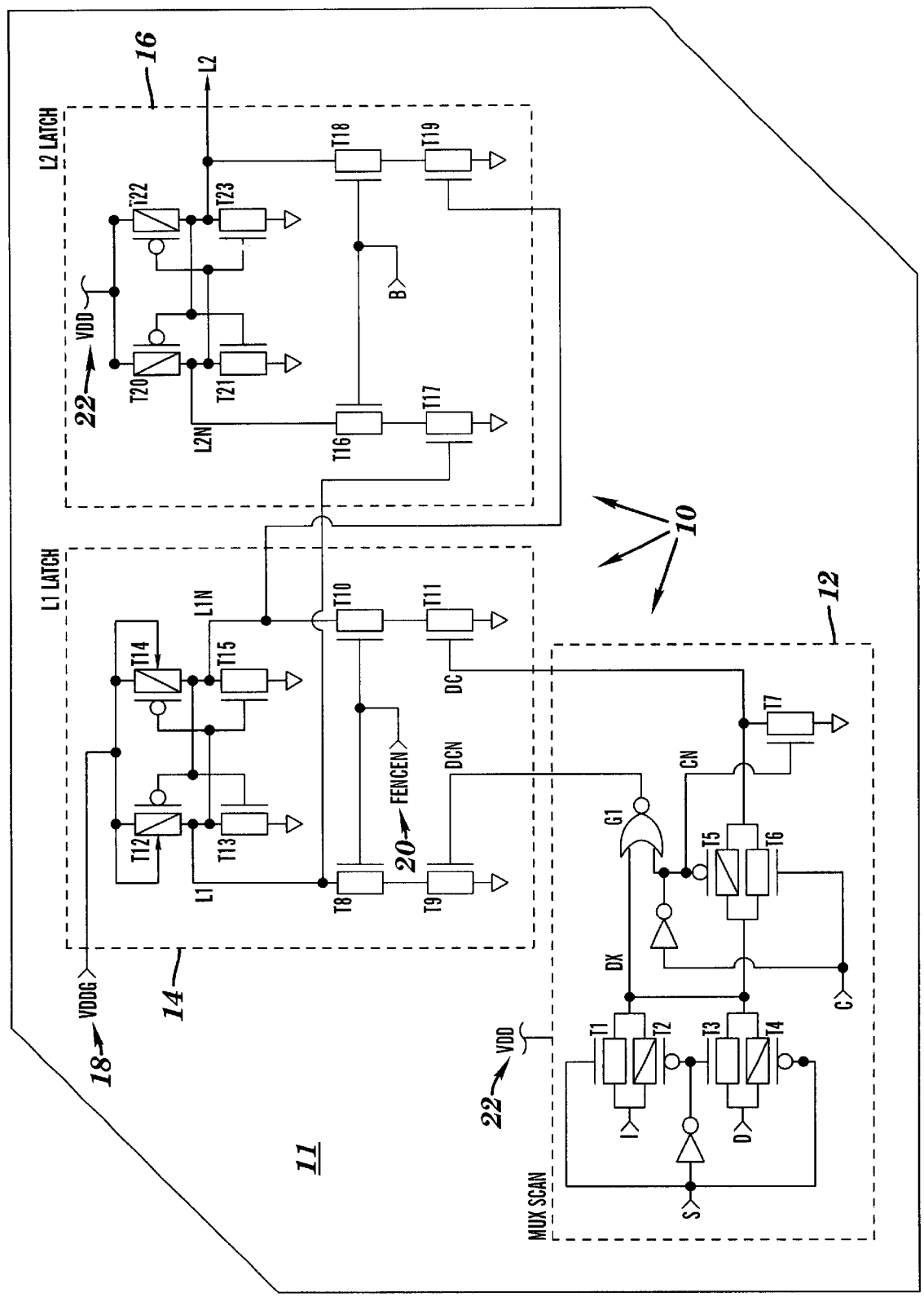

CMOS STATE SAVING LATCH

BACKGROUND OF THE INVENTION

1. Technical Field

The present invention relates generally to integrated circuits, and more particularly to an integrated circuit having a state saving latch.

2. Related Art

With the increasing popularity of portable electronic devices, such as laptops, cell phones and personal digital assistants (PDA's), there is a growing need for systems that can reduce power consumption in order to extend energy storage times of the device's power supply (e.g., battery). Namely, applications that utilize CMOS integrated circuits (IC's) require circuits that utilize a minimal amount of power and have the capability to be powered down when not in use.

Many electronic devices, including systems having custom and application specific IC's (ASIC) feature some form of standby, sleep, or low power mode—referred to collectively herein as sleep mode. These modes exhibit greatly reduced power dissipation by essentially disconnecting some of the logic in the device from the power supply when the logic is not required. Powering down portions of an IC cannot only be used to save power and extend battery life, but can be used in certain schemes to manage chip power in systems operating from a standard power supply.

Recovery from sleep mode generally requires returning the IC to the state it was in just prior to entering sleep mode. However, without power, storage elements in an IC will lose their stored bits of information. Accordingly, for commonly used elements, such as data latches, the stored value in the latch must be maintained when the IC is switched to sleep mode and be restored after power-up. Accordingly, a need exists for circuitry that can save the state of a latch before power-down, and restore the state of the latch after power-up.

SUMMARY OF THE INVENTION

The present invention addresses the above-mentioned problems, as well as others, by providing a circuit having a state saving mode of operation. In a first aspect, the invention provides a state saving circuit, comprising: a first latch powered by an uninterrupted power supply, wherein the first latch includes a first pair of cross coupled inverters for storing data, and includes an input cut-off control for isolating the data in the first pair of cross coupled inverters; a second latch coupled to an output of the first latch and powered by an interruptible power supply, wherein the second latch includes a second pair of cross coupled inverters and a clock input for latching the data from the first latch to the second latch; and wherein an interruption of power to the second latch results in a state being maintained in the first latch.

In a second aspect, the invention provides a method of saving a state in a circuit, comprising: providing a first latch powered by an uninterrupted power supply, wherein the first latch includes a first pair of cross coupled inverters for storing data, and includes an input cut-off control for cutting off input into the first latch; providing a second latch coupled to an output of the first latch and powered by an interruptible power supply, wherein the second latch includes a clock input for latching the data from the first latch to the second latch; inputting and storing data in the first latch; activating the input cut-off control to cut off further input into the first latch; and interrupting the power supply to the second latch.

In a third aspect, the invention provides a system having a power down mode for managing power consumption, the system having a state saving circuit, comprising: a first latch powered by an uninterruptible power supply, wherein the first latch includes a data input for receiving data and a storage circuit for storing received data; a second latch coupled to an output of the first latch and powered by an interruptible power supply, wherein the second latch includes a clock input for latching the data from the first latch to the second latch; and an input cut-off control for isolating data in the first latch by preventing further data from being inputted to the first latch, wherein the input cut-off control is activated when power to the interruptible power supply is cut off.

BRIEF DESCRIPTION OF THE DRAWINGS

An exemplary embodiment of the present invention will hereinafter be described in conjunction with the appended drawing, where like designations denote like elements, and wherein:

The FIGURE depicts an exemplary circuit in accordance with the present invention.

DETAILED DESCRIPTION OF THE INVENTION

Referring now to the FIGURE, an exemplary state saving circuit 10 is shown. The state saving circuit 10 can be utilized in any device or system 11 that incorporates power consumption management, e.g., sleep mode, and requires data to be saved during power down periods. Such devices may include, e.g., a handheld device, a cellular phone, a laptop, an integrated circuit, etc., and may utilize one or more state saving circuits 10.

The circuit 10 is composed of three stages, an input stage (or circuit) 12, an L1 latch stage 14, and an output or L2 latch stage 16. Circuit 10 utilizes an interruptible power supply VDD 22 to power the input and output stages 12,16, and an uninterruptible power supply VDDG 18 to power the L1 latch stage 14. Interruptible power supply VDD 22 may comprise any power source that can be toggled off and on for the purposes of power management, e.g., to place the overall system 11 in a sleep mode. Uninterruptible power supply VDDG 18 may comprise any power source that remains on during periods of power management, e.g., during sleep mode. As will be described, circuit 10 allows data to be saved while power to the input stage 12, the L2 latch stage 16, and other system components, is interrupted or powered down into a sleep mode. Specifically, data is maintained in the L1 latch stage 14, which saves the state of the data passing through circuit 10 when VDD 22 is turned off.

The input stage 12 is shown comprising a multiplexor scan circuit (Mux Scan) capable of receiving two different types of input and a clock signal C. It should be recognized, however, that any type of "input circuit," including a simple input line, could be utilized to exploit the state saving feature of the invention. In this exemplary embodiment, the input stage 12 is powered from VDD 22 and has two data input pins, a scan input (I) for receiving scanned in test data from a scan chain, and a data input (D) for receiving data input. A select input (S) is used to select between the data input and the scan input. A zero applied to the S input will allow data from the D input to propagate to node DX and a one at the S input will allow scan data from the I input to propagate to node DX.

The C clock input to the input stage 12 is used to clock the propagating data to the L1 stage 14 via DC and DCN. When the S input is a one, the transmission gate formed by transistors T1 and T2 will pass the data from input I to node DX. When the S input is a zero, the transmission gate formed by transistors T3 and T4, will pass the data from the D input to node DX. When DX is a one and the C clock goes high, the input stage 12 output "DC" will go high and remain high as long as the C clock and node DX remain high. Under all other conditions, DC will be held low. When node DX is a zero and the C clock goes high, input stage 12 output "DCN" goes high and will remain high as long as the C clock is high and node DX is held low. Under all other conditions DCN will be held low.

The L1 latch stage 14 receives data via DC and DCN from the input stage 12 and outputs data to the L2 latch stage 16 via L1 and L1N. The L1 latch stage 14 stores data using a pair of cross coupled inverters, the first formed by transistors T12 and T13, and the second formed by transistors T14 and T15. VDDG 18, which powers this stage, is an uninterruptible global power supply that always remains on or high. Accordingly, when circuit 10 goes into a sleep mode, the L1 latch stage 14 remains powered. An input cutoff control, made up of input FENCEN 20 and transistors T8 and T10, can be used to turn off the input DCN and DC to the L1 latch stage 14. Input FENCEN 20 is also powered by VDDG 18 and remains deactivated, i.e., high, under normal operations so that data can freely flow into the L1 latch stage 14 via input transistors T9 and T11. With FENCEN 20 high, a one at DC and a zero at DCN will force node L1 high and node L1N low. When the input DC goes low and DCN remains low, the state of L1 and L1N will be held or stored on the via the cross coupled inverters until node DCN goes high and node DC stays low. When DCN goes high and DC remains low, the states of L1 and L1N will switch forcing L1N high and L1 low.

The L2 latch stage 16 is similar to the construction of the L1 latch stage 14. However, the L2 stage is powered from interruptible power supply VDD 22 and uses a B clock to pass data from its input nodes L1, L1N to its output nodes L2, L2N, respectively. When the B clock is high, L1 is high and L1N is low, then output L2 is forced to a one and L2N is forced to a zero. L2 will stay high as long as B is high, L1 is high and L1N is low. When the B clock goes low, the states for L2 and L2N are held or latched in the cross coupled inverters formed by T20, T21, T22 and T23. Changes in L1 and L1N will not affect the state of L2 and L2N when B is low because transistors T16 and T 18 are off and cross coupled inverters will hold the states of L2 and L2N. L2 will only go low again when the B clock is high, L1 is a zero and L1N is a one. The above describes the basic operation of a scannable L1, L2 data latch running in a normal power mode.

Next, the circuit 10 is described operating in its state saving mode when interruptible power supply VDD 22 is interrupted or turned off. Before power supply VDD 22 is powered down, C clock is held low to latch the state of the L1 latch 14. Next, the input cut-off control is activated, i.e., FENCEN 20 is switched low, cutting off transistors T8 and T10. This isolates the cross coupled inverters T12, T13, T14 and T15 from all other devices in the circuit and stores the current state in L1 latch stage 14. VDD 22 can then be powered down to zero volts and the states of L1 and L1N will be held because transistors T12–T15 are powered from VDDG 18, which stays high when VDD 22 is powered down.

When the circuit 14 comes out of its power saving state, VDD 22 is powered back up to its operating voltage. At this point with FENCEN 20 still low, the state of L1 can be transferred to L2 by pulsing the B clock high and restoring the state of the L2 latch to the original state before VDD 22 was powered down. FENCEN 20 is then switched high (i.e., input cut-off control is deactivated) and the L1 latch stage can resume its normal mode of operation.

Another option for powering the circuit 10 back up is to hold the C clock low after VDD 22 is powered up, then bring FENCEN 20 high. The L1 state can then be transferred to the L2 by bringing the B clock high, or the L1 state can be updated by switching the C clock high. At this point, the latch can also resume its normal mode of operation.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A state saving circuit, comprising:
   a first latch powered by an uninterrupted power supply, wherein the first latch includes a first pair of cross coupled inverters for storing data, and includes an input cut-off control for isolating the data in the first pair of cross coupled inverters;
   a second latch coupled to an output of the first latch and powered by an interruptible power supply, wherein the second latch includes a second pair of cross coupled inverters and a clock input for latching the data from the first latch to the second latch; and
   wherein an interruption of power to the second latch results in a state being saved in the first latch.

2. The state saving circuit of claim 1, further comprising a multiplexor scan circuit powered by the interruptible power supply, wherein the multiplexor scan circuit includes a first input for receiving test data, a second input for receiving input data, a select input for selecting either the first or second input, and an output coupled to the first latch.

3. The state saving circuit of claim 2, wherein the multiplexor scan circuit includes a second clock input for propagating data to the first latch.

4. The state saving circuit of claim 1, wherein the input cut-off control for isolating the data in the first pair of cross coupled inverters is triggered when the interruptible power supply is interrupted.

5. The state saving circuit of claim 1, wherein the first latch receives input from a first input and a second input, wherein an inputted "1,0," respectively, will store a high state in the first latch, an inputted "0,1," respectively, will store a low state in the first latch, and an inputted "0,0" will cause a hold state.

6. The state saving circuit of claim 1, wherein the clock input will cause data to be latched into the second latch when the clock input is high, and cause data to be held in the second latch when the clock input is low.

7. A method of saving a state in a circuit, comprising:
   providing a first latch powered by an uninterrupted power supply, wherein the first latch includes a first pair of cross coupled inverters for storing data, and includes a input cut-off control for cutting off input into the first latch;
   providing a second latch coupled to an output of the first latch and powered by an interruptible power supply, wherein the second latch includes a clock input for latching the data from the first latch to the second latch;

inputting and storing data in the first latch;

activating the input cut-off control to cut off further input into the first latch; and interrupting the power supply to the second latch.

8. The method of claim 7, further comprising:

re-supplying power to the second latch;

pulsing the clock input to cause data stored in the first latch to be transferred to the second latch; and deactivating the input cut-off control to allow further input into the first latch.

9. The method of claim 7, further comprising:

re-supplying power to the second latch;

providing an input circuit to prevent data from being input into the first latch; and deactivating the input cut-off control.

10. The method of claim 9, further comprising: a pulsing the clock input to transfer data from the first latch to the second latch; and allowing the input circuit to input data into the first latch.

11. The method of claim 7, wherein the input cut-off control cuts off input into the first latch when the interruptible power supply is turned off.

12. A system having a power down mode for managing power consumption, the system having a state saving circuit that comprises:

a first latch powered by an uninterruptible power supply, wherein the first latch includes a data input for receiving data and a storage circuit for storing received data;

a second latch coupled to an output of the first latch and powered by an interruptible power supply, wherein the second latch includes a clock input for latching the data from the first latch to the second latch; and an input cut-off control for isolating data in the first latch by preventing further data from being inputted to the first latch, wherein the input cut-off control is activated when power to the interruptible power supply is cut off.

13. The system of claim 12, wherein the input cut-off control comprises a input transistor coupled to the data input.

14. The system of claim 13, wherein the input transistor is controlled by the interruptible power supply.

15. The system of claim 12, further comprising an input circuit powered by the interruptible power supply, wherein the input circuit includes a first input for receiving test data, a second input for receiving input data, a select input for selecting either the first or second input, and an output coupled to the first latch.

16. The system of claim 15, wherein the input circuit includes a second clock input for propagating data to the first latch.

17. The system of claim 12, wherein the power down mode comprises a sleep mode.

18. The system of claim 12, wherein the system comprises a hand held device.

19. The system of claim 12, wherein the system comprises a cellular phone.

20. The system of claim 12, wherein the system comprises an integrated circuit.

* * * * *